US006366470B1

United States Patent
Goessel et al.

(10) Patent No.: US 6,366,470 B1
(45) Date of Patent: Apr. 2, 2002

(54) DEVICE FOR LOCKING CARDS OR CACHES INTO PLACE IN THE FRAME OF A COMPUTER CENTRAL UNIT

(75) Inventors: Fabien Goessel, Limeil Brevannes; Georges Taguay, Sevran, both of (FR)

(73) Assignee: E2A Technology S.A. (FR)

( * ) Notice: Subject to any disclaimer, the term of this patent is extended or adjusted under 35 U.S.C. 154(b) by 0 days.

(21) Appl. No.: 09/578,110

(22) Filed: May 24, 2000

(30) Foreign Application Priority Data

May 27, 1999 (FR) .............................. 99 06704

(51) Int. Cl.[7] .............................. H05K 7/14; H05K 7/18
(52) U.S. Cl. ..................... 361/796; 361/801; 361/802; 361/684; 361/683; 248/222.11; 248/27.3; 24/548
(58) Field of Search ................................ 361/796, 800, 361/801, 802, 825, 692, 683, 787, 684, 726, 759; 211/41.17; 206/719; 24/548, 563; 248/560, 222.11, 694, 27.3

(56) References Cited

U.S. PATENT DOCUMENTS

| 4,375,290 A | * | 3/1983 | Zucchi et al. .................. 277/12 |
| 5,121,296 A | | 6/1992 | Hsu ............................ 361/395 |
| 5,317,483 A | | 5/1994 | Swindler ..................... 361/801 |
| 5,575,546 A | | 11/1996 | Radloff ........................ 312/183 |
| 5,601,349 A | * | 2/1997 | Holt ......................... 312/265.6 |
| 5,640,309 A | | 6/1997 | Carney et al. ............... 361/801 |
| 5,673,175 A | | 9/1997 | Carney et al. ............... 361/686 |
| 5,694,291 A | * | 12/1997 | Feightner ..................... 361/683 |
| 5,757,618 A | | 5/1998 | Lee ............................. 361/686 |
| 5,936,835 A | * | 8/1999 | Astier ......................... 361/684 |
| 5,947,571 A | * | 9/1999 | Ho ........................... 312/265.6 |
| 5,975,953 A | * | 11/1999 | Peterson ..................... 439/607 |

FOREIGN PATENT DOCUMENTS

| DE | 297 13 121 | 7/1997 | ............. G06F/1/16 |
| EP | 0 666 524 | 1/1995 | ............. G06F/1/18 |
| EP | 0 831 387 | 9/1996 | ............. G06F/1/18 |

* cited by examiner

Primary Examiner—Jeffrey Gaffin
Assistant Examiner—Hung Bui
(74) Attorney, Agent, or Firm—Baker & Daniels

(57) ABSTRACT

A device for locking cards or caches into place in the frame of a computer central unit A device for locking cards into place in the frame of a computer central unit, comprising latch windows (21–24) in the form of slots provided in the rear face of the frame (1) and a clipping window (25). A latch (4) comprises a body (47) bearing latch fingers (41, 44) joined to a transverse connecting branch (46) and a clamping clip (45).

5 Claims, 1 Drawing Sheet

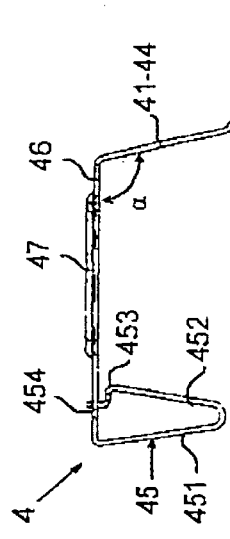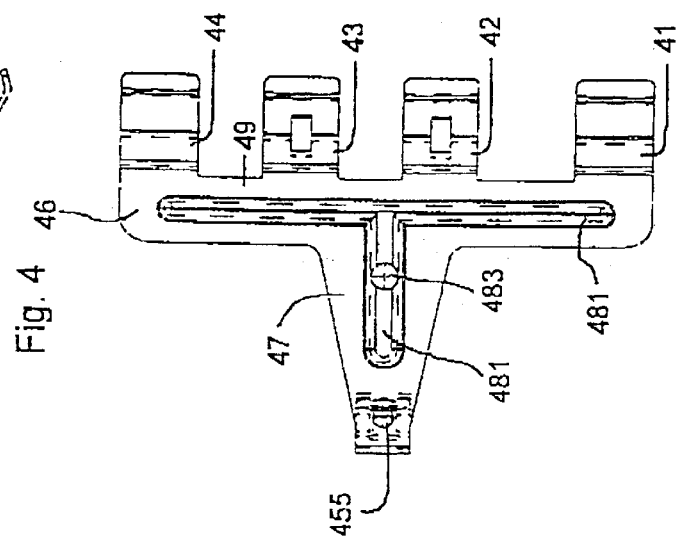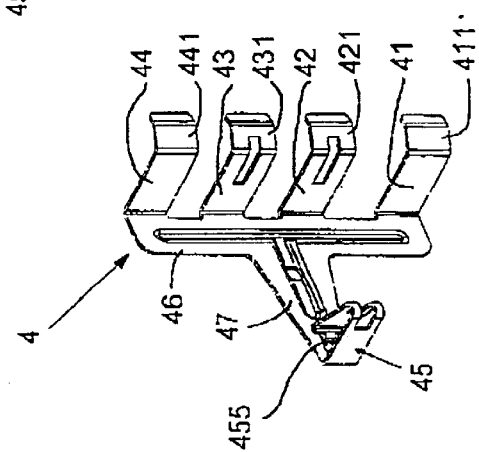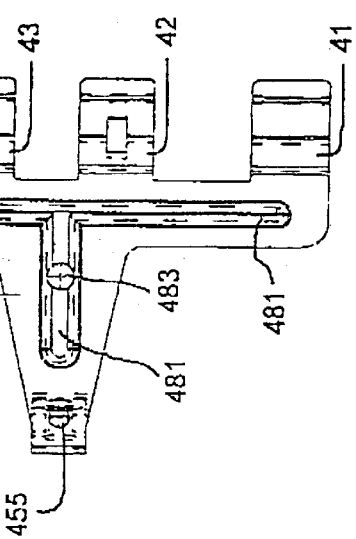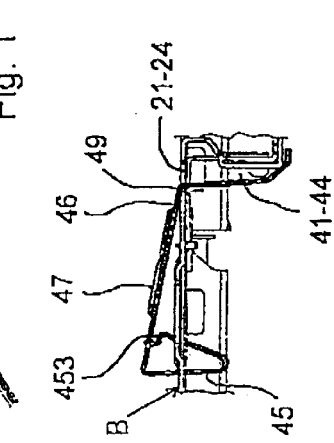

DEVICE FOR LOCKING CARDS OR CACHES INTO PLACE IN THE FRAME OF A COMPUTER CENTRAL UNIT

BACKGROUND OF THE INVENTION

1. Field of the Invention

The present invention relates to a device for locking into place the cards installed in the frame of a computer central unit or alternatively, in the absence of cards, caches fitted so that their connectors are exposed at adjoining, oblong orifices in the rear face of the frame, the cards being positioned by a sliding action and then locked in translation.

2. Description of the Related Art

At present, cards are mounted on a level with the rear face of a frame of a computer central unit by sliding them in a slide means on a level with the card connector, after which each card is locked in position by a screw. Each card is secured separately.

Although fixing screws is an everyday and relatively simple operation, particularly since the development of electric screwdrivers, it would be useful to simplify this operation of installing or uninstalling cards in a central unit by eliminating the need to screw in each card separately and finding a means of securing cards which is capable of withstanding the stress to which computer frames are normally subjected.

SUMMARY OF THE INVENTION

To this end, the invention relates to a device of the type outlined above, characterised by:
- latch windows in the form of slots, provided in the rear face of the frame upstream of the access orifices to the connectors in the direction in which the cards are inserted by a sliding action.
- at least one clipping window at a certain distance upstream of the latch windows, in the rear face of the frame,
- a latch comprising
  - a body bearing latch fingers
    - distributed in alignment with the gap of the connector slots,
    - joined to a transverse connecting branch,
    - folded back relative to the connecting branch,
  - a clamping clip located at a distance from the latch fingers substantially corresponding to the gap between the clipping window and latch windows,
  - the fingers being inserted in the latch slots so as to face the card connectors and locked by an elastic action as the latch is pivoted and the clip brought to bear elastically against the ends of the connectors in the clipping compartment.

This device is very easy to fit. Once the card or cards have been inserted in their slot, the fingers are slid through the latch windows and when the fingers have reached the end-of-travel position, the body of the latch is simply tilted so that the clamping clip enters its clipping window. The fingers bearing against the end of the card connectors create a torque which tends to cause the body of the latch to pivot in the direction in which its clamping clip is released. Conversely, when the latch is fitted and the clamping clip is hooked in its window the force of raising it creates a locking force which is applied to the connectors at the end of the cards and holds the unit firmly in place.

One extremely useful advantage of the invention is that is eliminates the screwing process: there is no need to provide a specific tool for the end user, the installer saves time if fitting large numbers and there is no risk of damage to the electronics due to screws being lost.

By virtue of other features of the invention:
- the latch is made in a single piece from elastic metal sheet, cut out and die-punched;
- the latch fingers are extended by folded ends;
- the cross-piece and the body are provided with a stiffening rib;
- the fingers are folded at an angle substantially in excess of 90° relative to the branch and to the body.

The present invention will be described in more detail below with reference to the appended drawings, of which:

BRIEF DESCRIPTION OF THE DRAWINGS

FIG. 1 is a perspective view of a part of the rear face of a frame of a computer central unit, this view being taken from inside the frame, FIG. 2 is a perspective view of the latch of the locking device illustrated in FIG. 1, FIG. 3 is a plan view of the latch illustrated in FIG. 2, FIG. 4 is a side view of the latch of FIG. 2, FIG. 5 is a view of the latch in which the fingers have already been positioned in the latch windows of the frame but in which the clip has still not been locked against the rear face of the frame.

DETAILED DESCRIPTION OF THE INVENTION

As illustrated in FIG. 1, the invention relates to a system of locking into place the connectors on the rear edge of computer cards; these cards are generally fitted by sliding them in guides provided in the rear face of a frame of a central unit 1 so that the connectors are accessible from the rear of the frame through oblong orifices which are not illustrated in the drawing.

The direction in which the cards are inserted is that defined by the arrow A. Conversely, in order to remove a card, it must be unlatched, as will be explained below, and slid in the direction opposite that denoted by arrow A. Arrow A will be used as a means of defining a position upstream or a position downstream of a reference point.

Accordingly and as proposed by the invention, the rear face 1 has latch windows 21, 22, 23, and 24, the number thereof corresponding to the number of connector slots 31, 32, 33, and 34. These windows 21–24 are located upstream and adjacent to connector slots 31–34.

A little farther upstream, the rear face 1 has a clipping window 25.

The locking device for the connectors, comprising a latch 4, is shown in its locked position in FIG. 1. This latch 4 consists of a set of fingers 41–44 one above the other, spaced apart at a distance equal to that of the connector slots 31–34 or associated windows 21–24. These fingers 41–44 are borne on a connecting branch 46 joined to the body 47, which in turn terminates with a clamping clip 45. The fingers are extended by folded-back tongues 411, 421, 431, 441 and the latch 4 as a whole, illustrated in this embodiment, is made by a stamping and folding process in one piece from elastic metal sheet or plastics material. The shape of the folded arrangement is clearly illustrated in FIG. 4. This plan view specifically shows the fold angle α between the fingers 41–44 and the connecting branch 46 and body 47 located in one plane. This side view also shows the shape of the clip 45, made by two folds of a tongue to form a triangular shape with its sides 451, 452, and an end forming a stop 453 for the clipping action. The stop 453 continues into an end 454 which is inserted in an orifice 455 of the body 47 (FIGS. 2 and 3).

The shape of the cambered end of each finger enables the card to be locked in two directions.

The connecting branch 46 and the body 47 are preferably stiffened by an indentation forming a rib 481, 482.

The fold between the fingers 41, 44 and the plane of the body 47 is preferably made along an angle α greater than 90° in order to create an elastic torque.

The way in which the latch 4 is fitted into the rear face after the connectors have been inserted in their guide is clearly illustrated in FIG. 5. In this drawings, the fingers 41–44 are firstly inserted in the latch windows 21–24, after which the body 47 with the connecting branch 46 is tilted in the direction of the arrow B so as to pivot about the joining ridge 49 between the fingers 41–44 and the connecting branch 46. As a result of this pivoting movement the clip 45 is pushed into its clipping window 25. During this movement, the part 452 is compressed against the part 451 of the clip 45 so that the widest part of the clip 45 passes through the entrance of the window 25 and the stop 453 locates behind the edge of the window 25, locking the latch relative to the rear face 1. The latch is removed by compressing 451 and 452 manually inside the frame in order to release the stop 453 from the rear face or edge of the window 25 and release the latch by a pivoting action in the direction opposite that of arrow B, after which the fingers 41–44 are pulled out. The connectors and the cards can then be removed.

We claim:

1. A device for locking data storage elements in a frame of a central unit of a computer, said data storage elements having connectors; said device comprising:
   a frame, said frame having at least one face;
   a plurality of orifices disposed in said face for receiving said data storage elements;
   a clipping window disposed in said face;
   a plurality of latch windows, said latch windows comprising slots, said latch windows disposed in said face;
   a latch, said latch comprising a body and a plurality of fingers, said fingers adapted for alignment with, and for insertion into, said latch windows, said latch further comprising a transverse connecting branch, said fingers joined to said transverse connecting branch, said fingers oriented at an angle relative to said connecting branch, said latch further comprising a resilient clip, said clip adapted for insertion into said clipping window by pivoting said latch relative to said face, whereby, after said clip is inserted into said clipping window, said data storage elements are locked into position and said clip resiliently secures the ends of said connectors.

2. The device of claim 1, wherein said latch is cut and die-punched from a unitary piece of resilient metal.

3. The device of claim 1, wherein said fingers include ends which are disposed at an angle relative to said branch and said latch body.

4. The device in claim 1, wherein said latch further comprises a cross-piece, said cross-piece including a stiffening rib.

5. The device of claim 1, wherein said latch fingers are disposed at an angle relative to said connecting branch, said angle greater than 90 degrees.

* * * * *

UNITED STATES PATENT AND TRADEMARK OFFICE
CERTIFICATE OF CORRECTION

PATENT NO.    : 6,366,470 B1
DATED         : April 2, 2002
INVENTOR(S)   : Goessel et al.

It is certified that error appears in the above-identified patent and that said Letters Patent is hereby corrected as shown below:

Title page,
Item [57], ABSTRACT, please change the ABSTRACT to read as follows:
-- A locking device for data storage elements into place in the frame of the central unit of a computer. The locking device includes a latch having a body with fingers. The fingers are joined to a transverse connecting branch and a resilient clip. The device also includes latch windows in the form of slots provided in one face of the frame, and at least one clipping window. The data storage element is inserted into its respective slot, and the fingers of the latch are slid through the latch windows. The fingers bear against the end of the card connectors, and create a torque which tends to cause the body of the latch to pivot in the direction in which its clip is released. Conversely, when the latch is fitted and the clip is hooked in its window, the force of raising the latch creates a resilient force which is applied to the connectors at the end of the data storage element and which holds the unit firmly in place. --

Column 4,
Line 29, please change "device in" to -- device of --

Signed and Sealed this

Tenth Day of September, 2002

Attest:

Attesting Officer

JAMES E. ROGAN
*Director of the United States Patent and Trademark Office*